United States Patent [19]
Akiyama

[11] Patent Number: 5,774,696
[45] Date of Patent: Jun. 30, 1998

[54] TRIANGLE AND TETRAHEDRON MESH GENERATION METHOD

[75] Inventor: Yutaka Akiyama, Tokyo, Japan

[73] Assignee: NEC Corporation, Tokyo, Japan

[21] Appl. No.: 654,190

[22] Filed: May 28, 1996

[30] Foreign Application Priority Data

May 29, 1995 [JP] Japan .................................. 7-130372

[51] Int. Cl.$^6$ .................................................. G06F 17/10
[52] U.S. Cl. .......................... 395/500; 395/123; 364/578
[58] Field of Search .................................... 364/488, 489, 364/490, 491, 578; 395/500, 920, 123

[56] References Cited

U.S. PATENT DOCUMENTS

| | | | |
|---|---|---|---|
| 4,912,664 | 3/1990 | Weiss et al. | 395/141 |
| 4,933,889 | 6/1990 | Meshkat et al. | 364/578 |
| 4,941,114 | 7/1990 | Shigyo et al. | 395/123 |
| 5,214,752 | 5/1993 | Meshkat et al. | 395/123 |
| 5,315,537 | 5/1994 | Blacker | 364/578 |
| 5,442,569 | 8/1995 | Osano | 364/578 |
| 5,553,009 | 9/1996 | Meshkat et al. | 364/578 |
| 5,553,206 | 9/1996 | Meshkat | 395/123 |
| 5,579,249 | 11/1996 | Edwards | 364/578 |
| 5,617,322 | 4/1997 | Yokota | 364/578 |

FOREIGN PATENT DOCUMENTS

| | | |
|---|---|---|
| 1-106266 | 4/1989 | Japan . |
| 4-268674 | 9/1992 | Japan . |
| 4-309183 | 10/1992 | Japan . |
| 7-219977 | 8/1995 | Japan . |
| 7-319947 | 12/1995 | Japan . |

OTHER PUBLICATIONS

C.S. Rafferty, et al., "Iterative Methods in Semiconductor Device Simulation", IEEE Transactions on Electron Devices, vol. ED–32, No. 10, Oct. 1985, pp. 2018–2027.

M.S. Mock, et al., Tetrahadral Elements and the Scharfetter–Gummel Method, Proceeding of the NASECODE IV, 1985, pp. 36–47.

Shigyo et al., "TRIMEDES: A triangular Mesh Device Simulator Linked w/ Topography/Process Simulation", Trans of IEICE, vol. E71 No. 10, Oct. 88, pp. 992–999.

Machek et al., "A Novel Finite—Element approach to Device Modeling", IEEE Trans on Elec. Dev., vol. ED–30 No. 9, Sep. 1983, pp. 1083–1092.

Kójima et al., "Dual Mesh Approach for Semiconductor Device Simulator", IEEE Trans on Magnetics, vol. 25 No. 4, Jul. 1989, pp. 2953–2955.

Chou et al., "Tangential Vector Finite Elements for Semiconductor Device Simulation", IEEE Trans on CAD, vol. 10 No. 9, Sep. 1991, pp. 1193–1200.

(List continued on next page.)

*Primary Examiner*—Kevin J. Teska
*Assistant Examiner*—Tyrone V. Walker
*Attorney, Agent, or Firm*—Ostrolenk, Faber, Gerb & Soffen, LLP

[57] ABSTRACT

A method for eliminating intersections between a substance boundary and triangles (or tetrahedra) of a triangle mesh (or tetrahedron mesh) which satisfies a condition of Delaunay partition and is used for a finite difference method. First, triangles intersecting with the substance boundary are searched out. One of the vertices of any of the triangles is selected as a moving node P and the moving node is projected to the substance boundary to obtain a projected point P'. Processing object triangles which commonly have the moving node and peripheral triangles which are positioned around the processing object triangles are listed. Then, checking to detect whether or not the projected point is included in a circumscribed circle about any of the peripheral triangles is performed. When the projected point is included in a circumscribed circle, a node is added at the projected point and triangles are produced using the node. But when the projected point is included in none of circumscribed circles, all of the processing object triangles are deleted, the moving node is shifted to the projected point, and triangles in a region from which the processing object triangles have been removed are reconstructed by using a maximum included angle method.

7 Claims, 8 Drawing Sheets

OTHER PUBLICATIONS

Yuan et al., "A Mesh Generator for Tetrahedral Elements Using Delaone Triangulation", IEEE Trans on Magnetics, vol. 29 No. 2, Mar. 1993, pp. 1906–1909.

Kumashiro et al., "A Triangular Mesh Generation Method Suitable for the Analysis of Complex MOS Device Structures", NUPAD V, pp. 167–170, 1994.

Tanimoto et al., "Discretization Error in MOSFET Device Simulation", IEEE Trans on CAD, vol. 11 No. 7, Jul. 1992, pp. 921–925.

Cianpolini et al., "Efficient 3–D Simulation of Complex Structures", IEEE Trans on CAD, vol. 10 No. 9, Sep. 1991, pp. 1141–1149.

TRIANGLE AND TETRAHEDRON MESH GENERATION METHOD

BACKGROUND OF THE INVENTION:

1. Field of the Invention:

This invention relates to a method of generating a triangle mesh or a tetrahedron mesh in a simulation which is based on a finite difference method or a like method.

2. Description of the Prior Art:

A device simulator for a semiconductor device calculates physical quantities in the inside of a semiconductor device using a computer to calculate electric characteristics such as a terminal current and a threshold voltage of a transistor. When it is attempted to optimize transistors in a semiconductor device represented by an LSI (large scale integration) so that the semiconductor device may exhibit its highest electric characteristics, use of the device simulator can significantly reduce both the cost and the term comparing with an actual production of a prototype of an LSI. Further, since the device simulator calculates physical quantities in the inside of a semiconductor transistor, it can be investigated in what manner electrons or holes behave in the inside of the semiconductor. Accordingly, the device simulator can be used to make clear, for example, a cause of an impact ionization phenomenon which becomes an issue with regard to a fine MOSFET (metal-oxide-semiconductor field effect transistor).

In order to obtain physical quantities in the inside of a semiconductor transistor, the device simulator solves a Poisson's equation which represents a relationship between the potential and the carrier concentration or a partial differential equation of an current continuity equation or a like equation. As a method of solving a partial differential equation, there is a method wherein a semiconductor device is divided into small regions and a partial differential equation is discretized and calculated as disclosed in Ryo Dan ed., "Process Device Simulation Technology", Sangyo Tosho, pp.90–122.

On the other hand, where an analysis of a semiconductor device having a complicated structure such as a trench structure is performed using a device simulator, in order to represent the shape or the structure of the semiconductor device accurately, the device shape is subdivided using a triangle to discretize it as disclosed in C. S. Rafferty et al., "Iterative methods in semiconductor device simulation", IEEE Trans. on Electron Devices, Vol. ED-32, No. 10, pp.2018–2027, Oct. 1985.

FIGS. 1A, 1B and 1C are cited from the paper of C. S. Rafferty et al. mentioned above and show a detailed example of a manner in which a trench isolated CMOS (Complementary MOS) device is discretized using triangular elements. A semiconductor device having such a sectional shape as shown in FIG. 1A is represented as such a set of triangular elements as shown in FIG. 1B. Further, in an area around a boundary between a p layer and p+ layer or a boundary between a p layer and an n layer, the semiconductor device is divided into finer or smaller triangular elements as seen in FIG. 1C. Since the shape of the semiconductor device is represented as a set of triangular elements, the trench structure can be represented accurately.

FIG. 2 shows, in an enlarged scale, part of the set of triangular elements obtained in this manner. In the solution of a partial differential equation based on a finite difference method which uses triangular elements, each grid point (vertex of a triangle) indicated by a solid circle mark in FIG. 2 is connected to a plurality of grid points positioned therearound by branches (sides of triangles) indicated by solid lines in FIG. 2, and the current J is defined on each branch. Further, the current J between grid points is integrated with respect to a cross section (indicated by a broken line) of a current path covered by each branch. The cross section of the current path is represented by line segments each interconnecting the circumcenters (represented by small blank triangles) of individual two triangles positioned on the opposite sides of the current path as a common edge. Accordingly, in order to perform a device simulation correctly, it is an essential condition that the circumcenters of adjacent triangles do not intersect with each other. This is because, if the circumcenters of adjacent triangles intersect with each other, then the cross section of the current path with respect to which the current is integrated becomes negative. Where the condition that the circumcenters of adjacent triangles do not intersect with each other is not satisfied, as seen in FIG. 3 (cited from the paper of C. S. Rafferty et al. mentioned hereinabove), a result of the analysis yields a physically impossible voltage spike at which the quasiFermi potential is 50 V. FIG. 3 is a view showing a result of a simulation by which a distribution of the quasi-Fermi potential of a device is detected. In order to satisfy the condition that the circumcenters of adjacent triangles do not intersect with each other, the Delaunay partition wherein a circumscribed circle about a triangle does not have a vertex of another triangle in the inside thereof should be assured.

By the way, as integration of LSIs proceeds and the device size decreases, a narrow channel effect and like effects of a MOSFET become progressively apparent, and it is necessary to execute a device simulation taking also the depthwise shape of a transistor into consideration. In order to subdivide an arbitrary shape accurately in such a three-dimensional problem, using a tetrahedron as a dividing element, a three-dimensional semiconductor device shape should be represented as a set of tetrahedral elements. In this instance, current is defined on an edge of a tetrahedron, and the cross section of a current path is represented by a face defined by line segments interconnecting the circumcenters of tetrahedra which commonly have the edge. Also in a three-dimensional problem, similarly as in the two-dimensional problem described above, the division into tetrahedra must be the Delaunay partition wherein a circumscribed sphere of the tetrahedron does not have a vertex of another tetrahedron in the inside thereof as disclosed in M. S. Mock, "Tetrahedral elements and the Scharfetter-Gummel method", Proceeding of the NASECODE IV, pp.36–47, 1985.

A method of Delaunay partition of a shape to be analyzed with tetrahedral elements is disclosed in the document of M. S. Mock mentioned above. Here, for simplified description, the Delaunay partition of a two dimensional region with triangular elements is described. The method by Mock adds a point on a substance boundary or a new node required to improve the accuracy in calculation one by one into a triangle set already Delaunay-partitioned. The method is illustrated in FIGS. 4A, 4B and 4C.

When to add a new node P' to a triangle set already Delaunay-partitioned, as shown in FIG. 4A, a triangle which includes the new node P' in the inside of a circumscribed circle thereabout is searched for. In FIG. 4A, each broken line indicates a circumscribed circle, and a slanting line region indicates triangles searched out. Thereafter, the searched out triangles are deleted as seen in FIG. 4B, and sides (indicated by broken lines in FIG. 4B) of an outermost hull defined by the deleted triangles are found out. Then, the sides of the outermost hull and the new node P' are connected to each other to produce new triangles as shown in FIG. 4C. In FIG. 4C, the triangles newly produced are indicated by slanting lines. Here, also the set of triangles produced newly satisfies a condition of Delaunay partition. While the two-dimensional Delaunay partition based on the method of Mock is described above, also the three-dimensional Delaunay partition is executed in a similar procedure.

In Japanese Patent Laid-Open Application No. Hei 7-219977 (JP, A, 7-219977), a method of deleting a node from within a region for which the Delaunay partition has been performed, while the condition of Delaunay partition remains satisfied is disclosed. According to the method, in order to delete a node in a two-dimensional plane, triangles are re-constructed using a maximum included angle method. In particular, a node (mesh point) to be deleted and mesh edges (sides of triangles) connecting to the node are deleted and, from among sides of a polygon which remains around the deleted node, a side which has not been processed as yet is selected. Thereafter, a vertex of the polygon with which the angle of the side included thereat exhibits a maximum value and by which a triangle can be defined together with the side is selected and a new triangle is produced with the selected side and the selected vertex. The sequence of operations just described is performed for all sides of the polygon. In order to delete a node in a three-dimensional space, tetrahedra are re-constructed using a minimum circumscribed sphere method. In particular, a node and mesh edges (sides of tetrahedra) connecting to the node are deleted first. Since a polyhedron whose faces are triangles remains around the deleted node, from among the triangles of the faces of the polyhedron, a triangle which has not been processed as yet is selected, and a vertex of the polyhedron with which the circumscribed sphere about the tetrahedron formed by the triangle and the vertex of the polyhedron exhibits the smallest size and by which a tetrahedron can be defined together with the face is selected. Then, a new tetrahedron is produced with the selected triangle and the selected vertex. The sequence of operations just described is performed for all faces, that is, for all triangles, of the polyhedron.

By the way, while, in the method which involves the Delaunay partition described above, triangles (or tetrahedra) are updated by addition or deletion of a node, it sometimes occurs that a triangle (or tetrahedron) and a substance shape boundary intersect with each other. Here, the substance shape boundary signifies, with regard to a semiconductor device, an interface between a wiring layer and a semiconductor layer, an interface between a semiconductor layer and an insulator, a pn junction plane in a semiconductor layer, or an interface between regions which are different in impurity concentration. In a semiconductor device simulator, since the shape of a wiring layer, insulator layer and semiconductor layer is represented as a set of triangles for an analysis in two dimensions or as a set of tetrahedra for an analysis in three dimensions, if a triangle (or tetrahedron) is produced across a substance shape boundary plane, then it becomes impossible to represent the shapes of different portions accurately, resulting in failure to perform an accurate analysis. Therefore, newly produced triangles (or tetrahedra) are checked to detect whether or not they intersect with any substance shape boundary, and where some triangle (or tetrahedron) intersects with a substance shape boundary, the intersection must be eliminated. The following methods are available to eliminate an intersection.

(Method 1)

The inventor of the present invention proposed an intersection elimination method in Japanese Patent Laid-Open Application No. Hei 7-319947 (JP, A, 7-319947). FIG. 5 is a flow chart illustrating a procedure of the method disclosed in JP, A, 7-319947. According to the method, a triangle (or tetrahedron) which intersects with a shape boundary is searched for first (step 91), and a vertex P of the intersecting triangle (tetrahedron) is projected on the shape boundary to obtain a projected point P' (step 92). A node is added at the projected point P' (step 93), and triangles (tetrahedra) are reproduced using the method of Mock described above (step 94).

(Method 2)

Japanese Patent Laid-Open Application No. Hei 4-309183 (JP, A, 4-309183) discloses a method wherein intersections are eliminated by addition of a node similarly as in the method of JP, A, 7-319947. However, a node to be added is not determined by projection on a shape boundary.

(Method 3)

Japanese Patent Laid-Open Application No. Hei 1-106226 (JP, A, 1-106266) discloses a technique wherein it is checked to detect whether or not a tetrahedron and a shape boundary (shape surface) intersect with each other and, where they intersect with each other, a vertex of the tetrahedron is moved to a position on the shape surface to eliminate the intersection. FIGS. 6A and 6B are diagrammatic views illustrating the method. In those figures, an ellipse shown represents a shape surface. As shown in FIG. 6A, a vertex of a tetrahedron (which is shown in triangular shape in FIG. 6A) which intersects with a shape boundary is moved to a position on the solid shape to eliminate the intersection.

(Method 4)

Japanese Patent Laid-Open Application No. Hei 4-268674 (JP, A, 4-268674) discloses elimination of an intersection not of a tetrahedron but of a hexahedron (square grid) by movement of a node. Where the position of a node of a grid is moved by optimization, an intersection between the square grid and a shape boundary is created. However, in JP, A, 4-268674, the intersection between the shape and the grid is eliminated by correcting the node moved using a shape function to a position on the solid shape.

However, the conventional methods described above which eliminate an intersection between a triangle or tetrahedron and a solid shape have the following problems. In particular, with the method 1 and the method 2, although the Delaunay partition is assured, since an intersection is eliminated adding a node, there is a problem that an increase in number of nodes and an increase in analysis time cannot be avoided. Meanwhile, with the method 3 and the method 4, even though the Delaunay partition is assured before elimination of an intersection, since a node is moved upon elimination of an intersection, the shape of a triangle (tetrahedron) changes, resulting in another problem that the Delaunay partition cannot necessarily be assured after elimination of an intersection.

SUMMARY OF THE INVENTION

It is an object of the present invention to provide a mesh generation method by which, upon elimination of an intersection between a shape boundary and a triangle (or tetrahedron), the Delaunay partition is assured after elimination of an intersection by suppressing out an increase in number of nodes.

The object of the present invention is achieved by a triangle mesh generation method wherein, from a triangle mesh which satisfies a condition of Delaunay partition, intersections between triangles constructing the triangle mesh and a substance boundary are eliminated, the method comprising steps of; searching for triangles which are included in the triangle mesh and intersect with the substance boundary; selecting one of vertices of any of the triangles intersecting with the substance boundary as a moving node, the one of vertices being not on the substance boundary and projecting the moving node on the substance boundary to obtain a projected point; listing triangles which commonly have the moving node as processing object triangles and listing triangles which are positioned around the processing object triangles as peripheral triangles; and checking to detect whether or not the projected point is included in a circumscribed circle about any of the peripheral triangles and, when the projected point is included in a circumscribed circle, adding a node at the projected point and producing triangles using the node, but when the projected point is not included in a circumscribed circle about any one of the peripheral triangles, deleting all of the processing object triangles, shifting the moving node to the projected point and re-constructing triangles in a region, from which the processing object triangles have been removed, using a maximum included angle method.

The object of the present invention is achieved also by a tetrahedron mesh generation method wherein, from a tetrahedron mesh which satisfies a condition of Delaunay partition, intersections between tetrahedra constructing the tetrahedron mesh and a substance boundary are eliminated, the method comprising steps of; searching for tetrahedra which are included in the tetrahedron mesh and intersect with the substance boundary; selecting one of vertices of any of the tetrahedra intersecting with the substance boundary as a moving node, the one of vertices being not on the substance boundary, and projecting the moving node on the substance boundary to obtain a projected point; listing tetrahedra which commonly have the moving node as processing object tetrahedra and listing tetrahedra which are positioned around the processing object tetrahedra as peripheral tetrahedra; and checking to detect whether or not the projected point is included in a circumscribed sphere about any of the peripheral tetrahedra and, when the projected point is included in a circumscribed sphere, adding a node at the projected point and producing tetrahedra using the node, but when the projected point is not included in a circumscribed sphere about any one of the peripheral tetrahedra, deleting all of the processing object tetrahedra, shifting the moving node to the projected point and re-constructing tetrahedra in a region, from which the processing object tetrahedra have been removed, using a minimum circumscribed circle method.

In the present invention, preferably, one of vertices of those triangles (tetrahedra) intersecting with the substance boundary which is spaced by the smallest distance from the substance boundary is selected as the moving node.

According to the present invention, one of vertices of some triangle (tetrahedron) intersecting with a substance boundary is selected as a moving node under the condition that the vertex is not on the substance boundary, and it is discriminated whether or not the condition of the Delaunay partition is still satisfied if the moving node is shifted to a projected point obtained by projecting the moving node on the substance boundary. Then, when the condition of the Delaunay partition is satisfied, the moving node is moved to the projected point and triangles (tetrahedra) are re-constructed using the moving node. However, when the condition of the Delaunay partition is not satisfied, the moving node is not shifted but the projected point is added as a node. Consequently, the Delaunay partition is assured and an increase in number of nodes can be suppressed to a necessary minimum level.

Generally, where a substance boundary and a triangle (tetrahedron) intersect each other, the number of such intersecting triangles (tetrahedra) is a plural number, and also the number of vertices which can be selected as a moving node is a plural number. Since it is considered that the probability that the Delaunay partition is maintained when a moving node is moved to a substance boundary increases as the distance between the moving node and the substance boundary decreases, in order to prevent an increase in number of nodes, it is effective to select, as a moving node, that one of vertices of triangles (tetrahedra) intersecting with the substance boundary which exhibits the smallest (but not zero) distance from the substance boundary.

Application of the present invention significantly reduces the calculation time of the finite difference method.

The above and other objects, features, and advantages of the present invention will become apparent from the following description based on the accompanying drawings which illustrate an example of a preferred embodiment of the present invention.

DESCRIPTION OF THE PREFERRED EMBODIMENTS

<<First Embodiment>>

Figure 7:
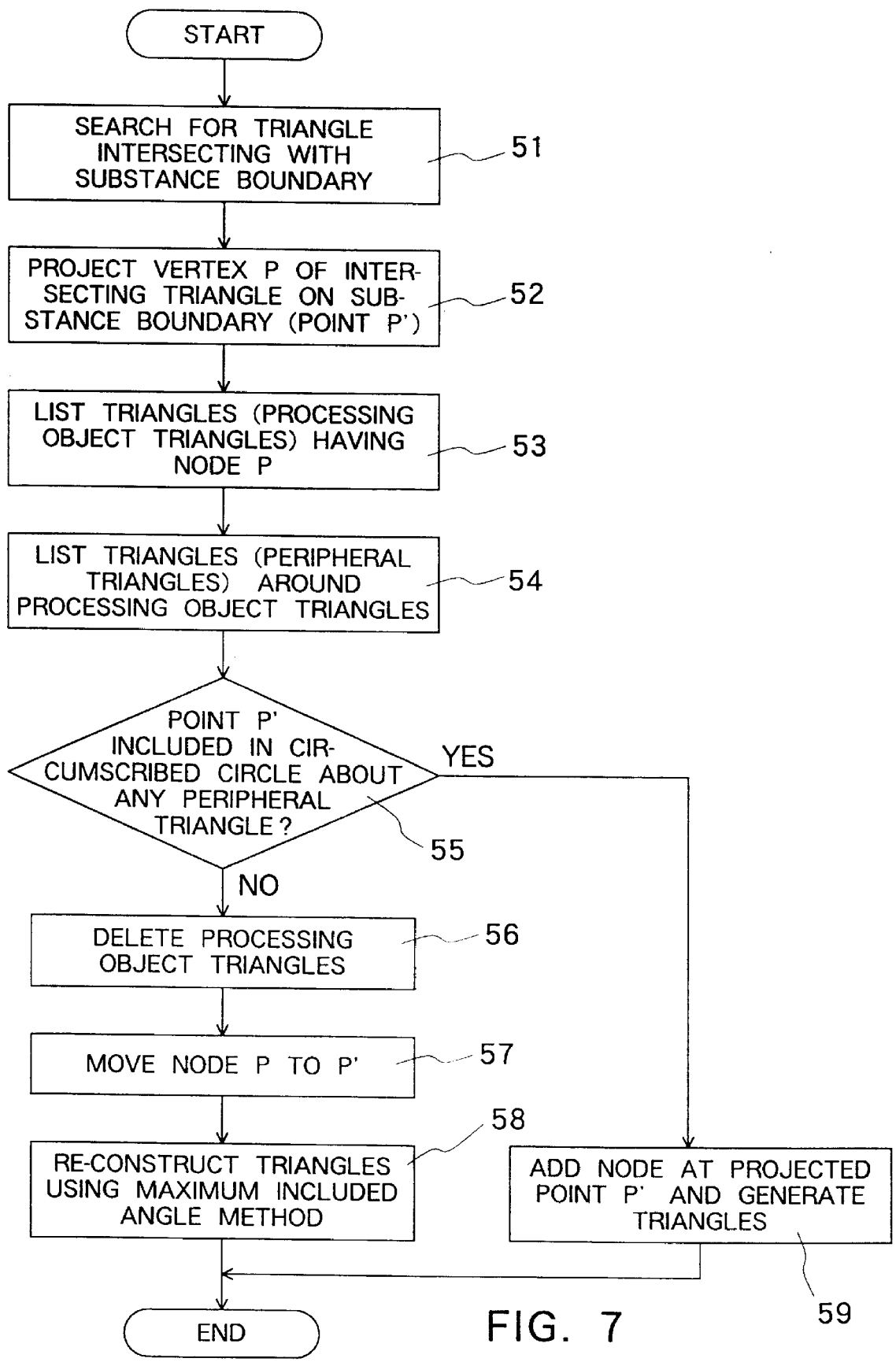
FIG. 7 is a flow chart illustrating processing by a triangle generation method of a first embodiment of the present invention.

Generation of a triangle mesh when an analysis based on a finite difference method in two dimensions is described with reference to FIG. 7. Further, FIGs. 8A to 8E illustrate different steps of a procedure for generation of a triangle mesh in order. First in step 51, one of the triangles which intersect with a substance boundary B is searched for from within a Delaunay divided triangle set. In the example shown in FIG. 8A, a triangle L1 intersects with the substance boundary B (indicated by a thick line in FIG. 8A). Then in step 52, one vertex which belongs to the triangle L1 searched out and is not on the substance boundary B is selected as a moving node P, and the moving node P is projected on the substance boundary B to obtain a projected point P'. Actually, since a plurality of triangles intersect with the substrate boundary B (in the example shown, with three triangles L1, L2 and L6), that one of the vertices of the three triangles which is not on the substance boundary B and is spaced by the smallest distance from the substance boundary B is selected as the moving node P.

Figure 1A:
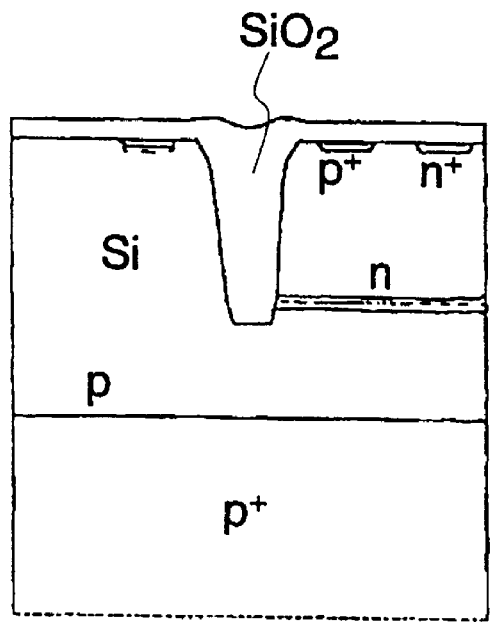
FIG. 1A is a sectional view of an example of a semiconductor device.
Figure 1B:
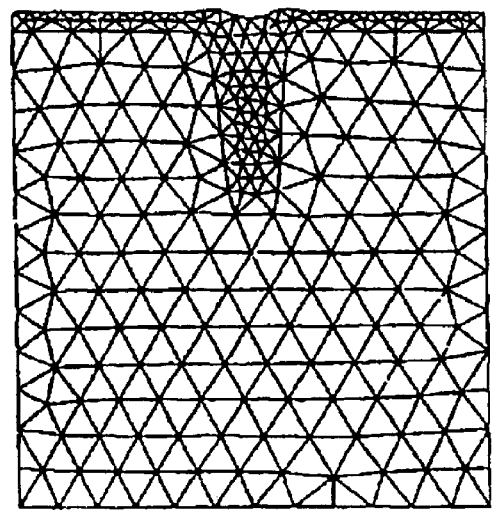
FIGS. 1B and 1C are diagrammatic views showing an example of a triangular mesh produced from the semiconductor device shown in FIG. 1A.
Figure 1C:
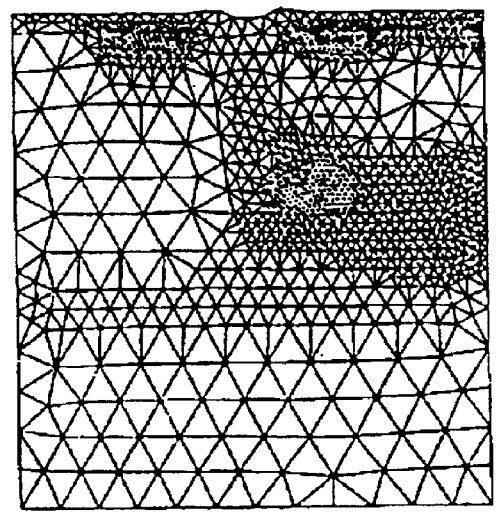
Figure 2:
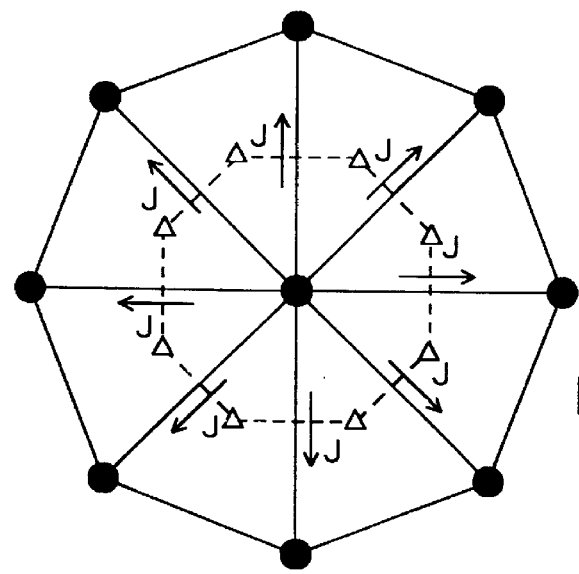
FIG. 2 is a diagrammatic view illustrating electric currents of a triangle mesh and an integration region thereof.
Figure 3:
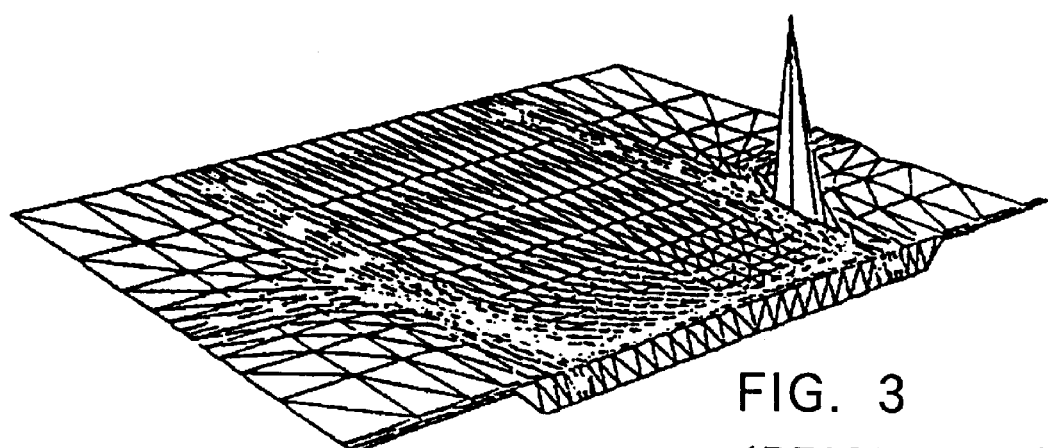
FIG. 3 is a diagrammatic view showing an example of a result of a simulation and illustrating that an intersection of circumcenters causes an inappropriate simulation result.
Figure 4A:
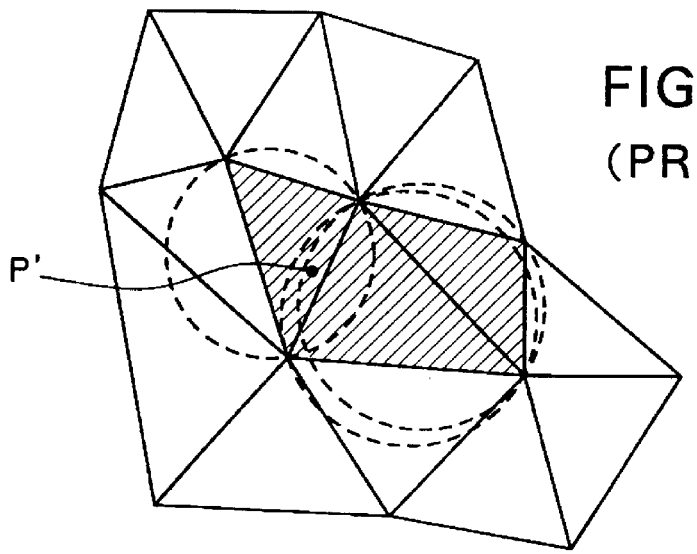
FIGS. 4A, 4B and 4C are diagrammatic views illustrating a method of the Delaunay partition in two dimensions.
Figure 4B:
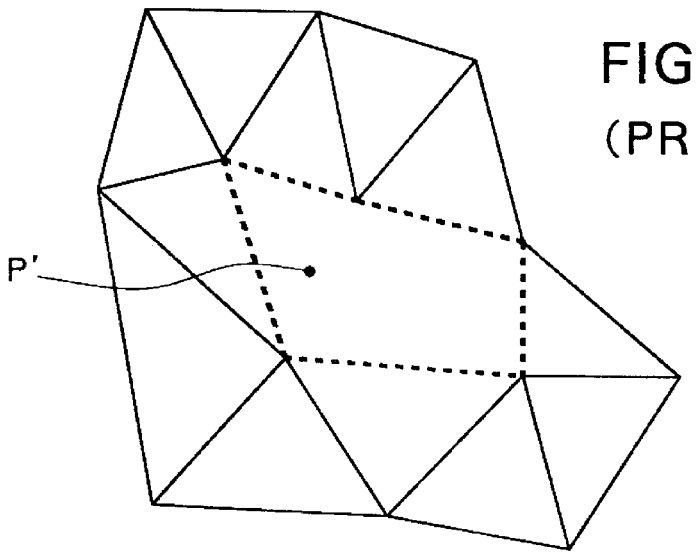
Figure 4C:
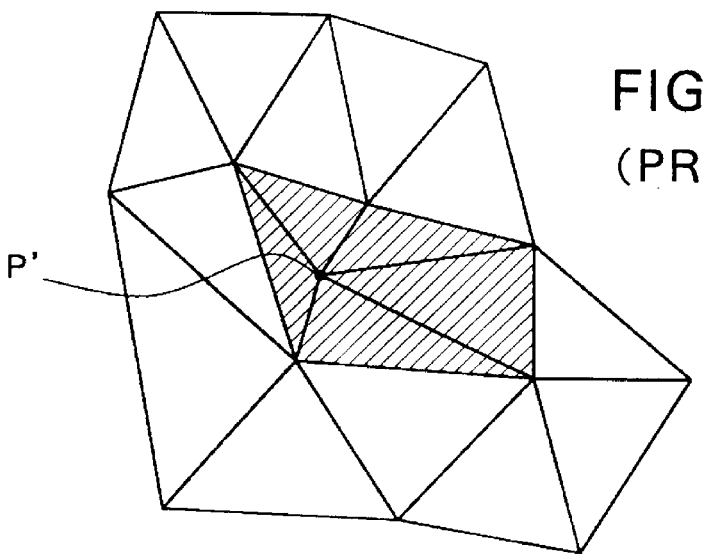
Figure 5:
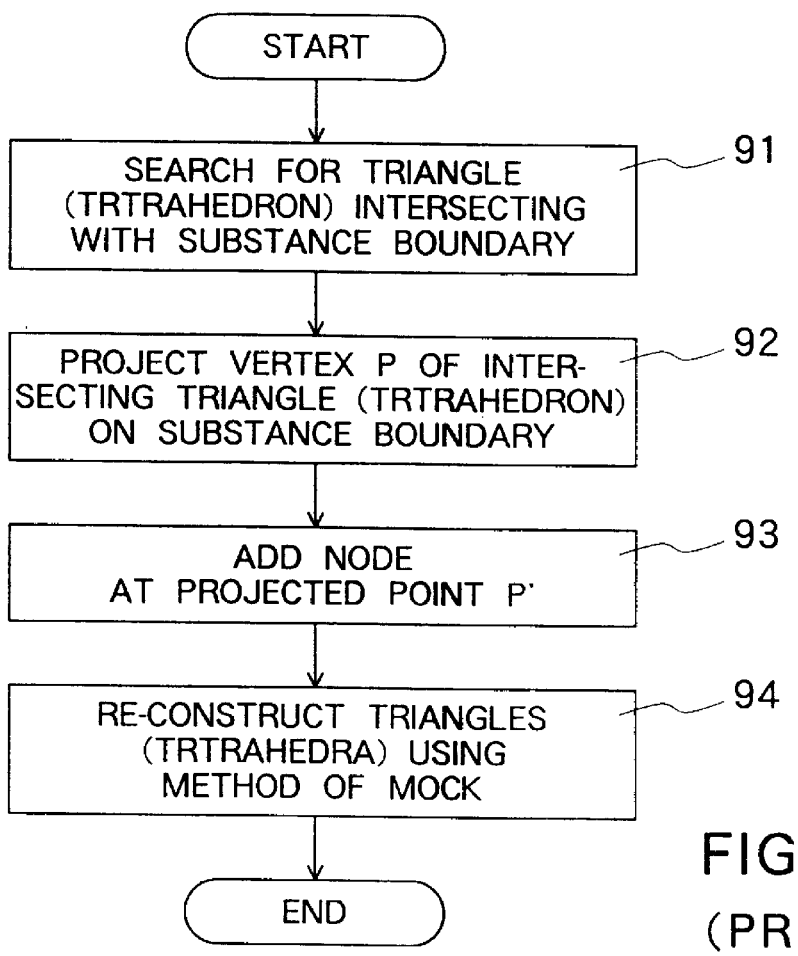
FIG. 5 is a flow chart illustrating an example of a conventional technique for eliminating an intersection between a triangle and a substance boundary.
Figure 6A:
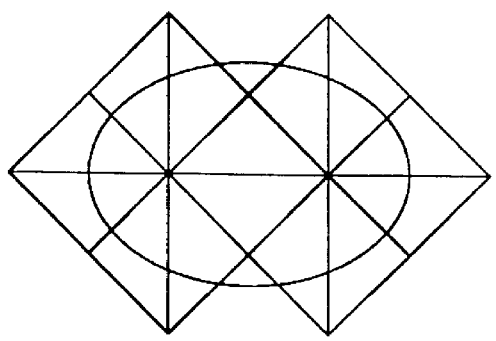
FIGS. 6A and 6B are diagrammatic views illustrating another conventional technique for eliminating an intersection between a triangle and a substance boundary.
Figure 6B:
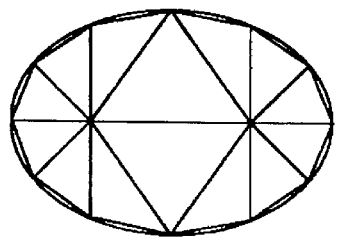

Then in step 53, those triangles, that is, processing object triangles, which commonly have the moving node P are listed. In the example shown in FIG. 8B, six processing object triangles L1 to L6 are involved. However, the three triangles L3 to L5 among them do not intersect with the substance boundary B. After the processing object triangles are listed, those triangles, that is, peripheral triangles, which are positioned around the processing object triangles are listed in step 54. The peripheral triangles are those triangles which have a common side with some of the processing object triangles but are not the processing object triangles themselves. In the example shown in FIG. 2B, six peripheral triangles J1 to J6 are involved.

Thereafter, in step 55, it is checked to detect whether or not the projected point P' is included in one of circumscribed circles about the peripheral triangles J1 to J6. The check is illustrated in FIG. 8C, in which broken line circles indicate the circumscribed circles of the peripheral triangles J1 to J6. When the projected point P' is included in one of the circumscribed circles, since this is the case in step 59 wherein the Delaunay partition is not satisfied when the moving node P is shifted as it is to the projected point P', the moving node P is not moved, but a node is added at the projected point P' and triangles are generated to eliminate the intersection, thereby ending the processing.

Figure 8A:
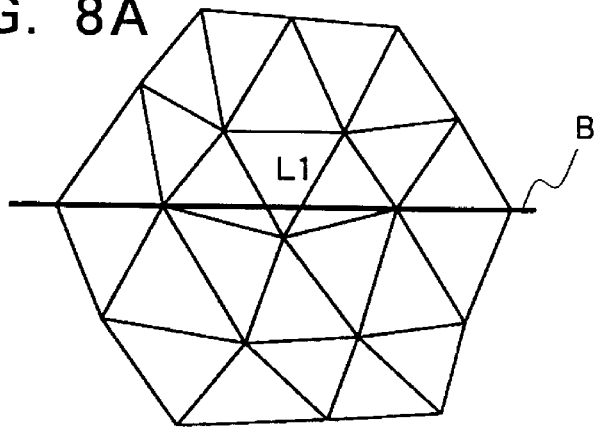
FIGS. 8A, 8B, 8C, 8D and 8E are diagrammatic views illustrating a concrete example of generation of a triangle mesh in the first embodiment.
Figure 8D:
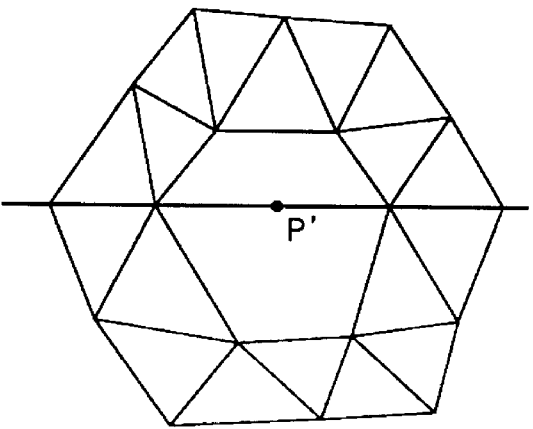
Figure 8B:
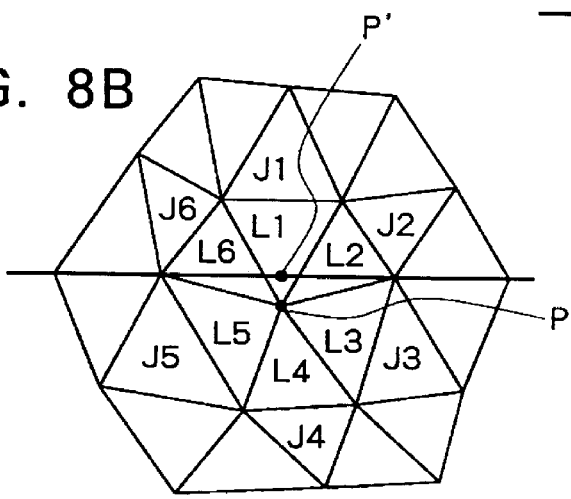
Figure 8C:
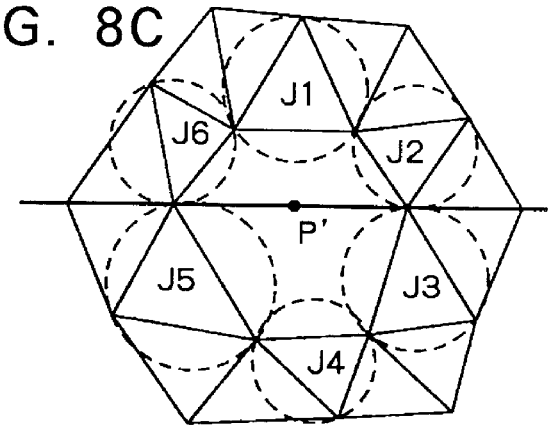
Figure 8E:
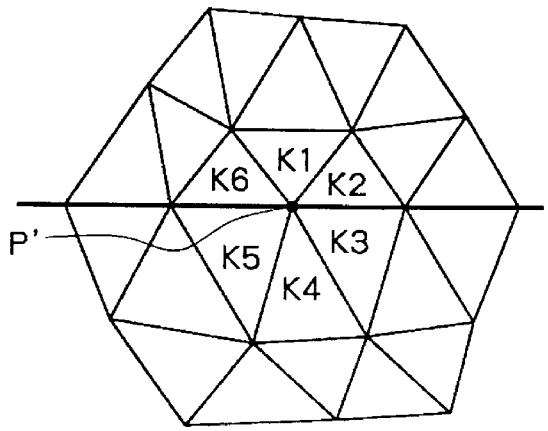

On the other hand, when the projected point P' is not included in any one of the circumscribed circles in step 55, all of the processing object triangles L1 to L6 are deleted in step 56 as shown in FIG. 8D. Then, the moving node P is shifted to the projected point P' in step 57, whereafter the control sequence advances to step 58. In step 58, using a maximum included angle method, triangles are re-constructed, in the region from which the processing object triangles were deleted in step 56, using outermost hull sides of the region and the node P' after the movement, thereby ending the processing. FIG. 8E shows a set of triangles after the re-construction, and the re-constructed triangles are denoted at K1 to K6.

Intersections between triangles and a substance boundary are eliminated by the processing described above.

Figure 9:
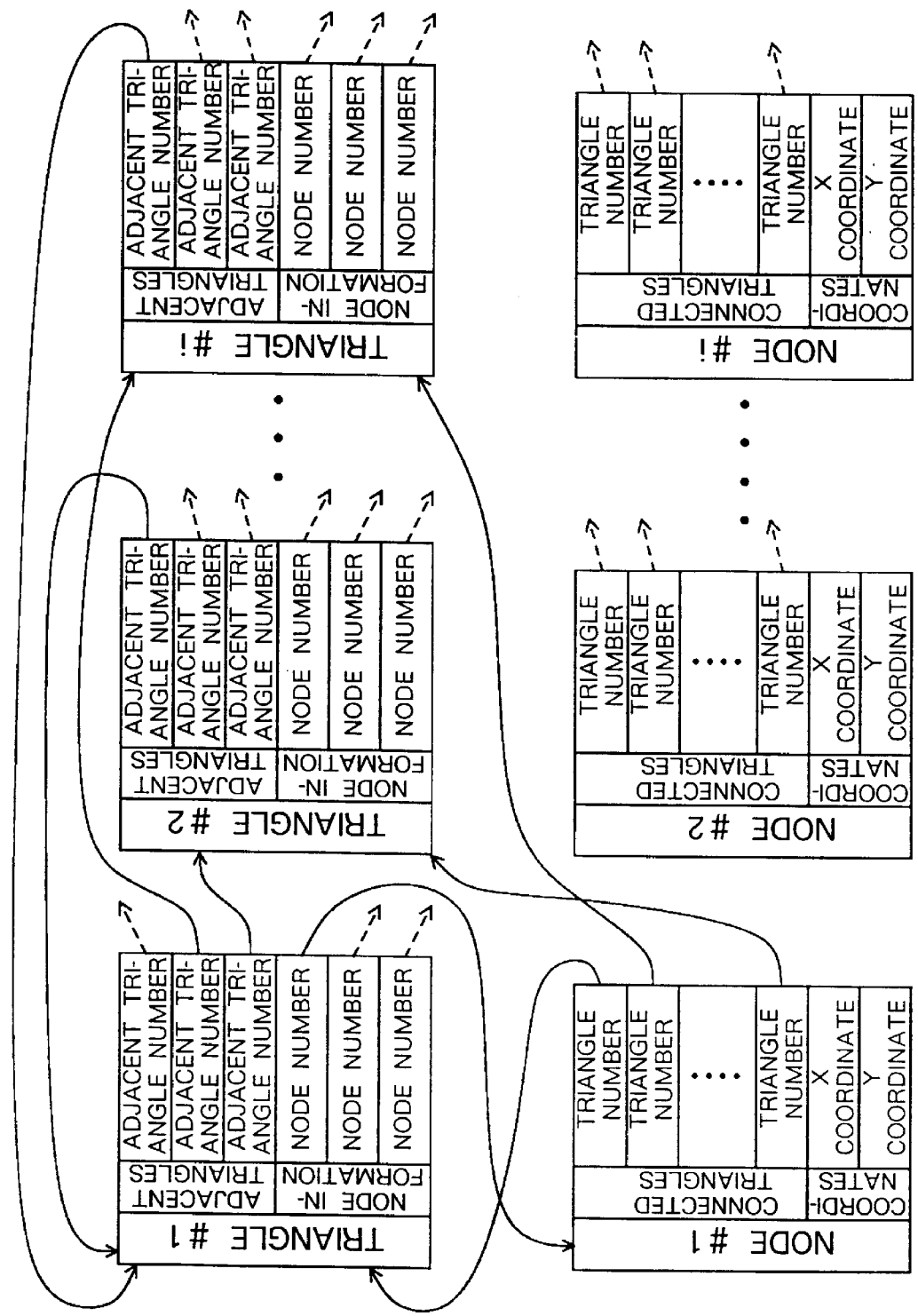
FIG. 9 is a diagrammatic view showing a structure of data to be used for elimination of an intersection with a substance boundary.

Next, an example of a structure of data used when the processing described above is performed is described with reference to FIG. 9. In the data structure shown, numbers are applied to triangles and nodes involved. Here, a triangle which has a common side with the attended triangle is defined as an adjacent triangle of the attended triangle. For each of the triangles, the numbers of adjacent triangles and the nodes included in the triangle are stored in a memory. Each node is one of vertices of the triangle. Further, for each node, the numbers of those triangles, that is, connecting triangles, which have the node as a vertex and the coordinate values of the node are stored in a memory. Where data of the structure described are used, the individual triangle numbers and the numbers of the nodes constructing the triangles correspond to each other, and it can be executed readily to obtain a node number or numbers from a triangle number and conversely to obtain, from a node number, a number of a triangle which includes the node of the node number. Further, since the adjacent triangle numbers are stored in a memory, information of triangles adjacent any triangle can be obtained readily.

Where the data structure described is employed, when to list processing object triangles in step 53 described above, it is only required to retrieve the triangle numbers of connection triangles from the data of the node number corresponding to a moving node. Further, when to list peripheral triangles in step 54, it is only required to remove the processing object triangles from a set of triangles listed as adjacent triangles in the data of the processing object triangles.

<<Second Embodiment>>

Figure 10:
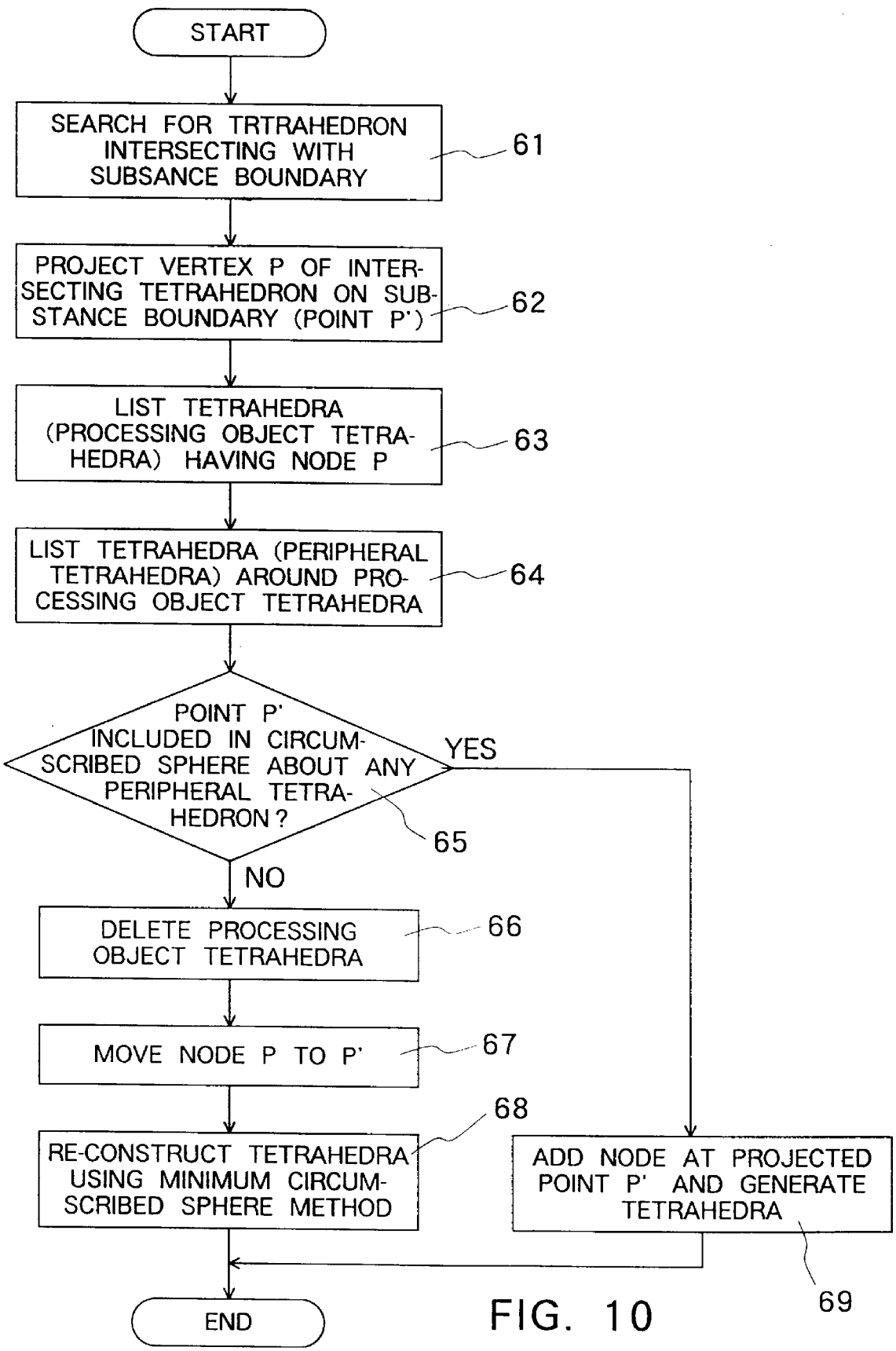
FIG. 10 is a flow chart illustrating processing by a tetrahedron generation method of a second embodiment of the present invention.

Generation of a tetrahedron mesh when an analysis based on a finite difference method in three dimensions is performed is described with reference to FIG. 10.

First in step 61, from within a Delaunay-partitioned tetrahedron group, a tetrahedron which intersects with a substance boundary is searched for. Then in step 62, one vertex which belongs to the tetrahedron searched out and is not present on the substance boundary is selected as a moving node P, and the moving node P is projected on the substance boundary to obtain a projected point P'. Actually, since a plurality of tetrahedra intersect with the substance boundary, one of vertices of the tetrahedra which is not present on the substance boundary and is spaced by the smallest distance from the substance boundary is selected as the moving node P. In step 63, those tetrahedra, that is, processing object tetrahedra, which commonly have the moving node P are listed, and then in step 64, those tetrahedra, that is, peripheral tetrahedra, which are positioned around the processing object tetrahedra are listed. The peripheral tetrahedra signifies those tetrahedra which commonly have an edge with some of the processing object tetrahedra but are not the processing object tetrahedra themselves.

Then in step 65, it is checked to detect whether or not the projected point P' is included in a circumscribed sphere of any of the listed peripheral tetrahedra. When the projected point P' is included in one of the circumscribed spheres, since this is the case wherein the Delaunay partition is not satisfied when the moving node P is shifted as it is to the projected point P', the control sequence advances to step 69, in which a node is added at the projected point P' without moving the moving node P and tetrahedra are produced using the added node to eliminate the intersection, thereby ending the processing.

On the other hand, when the projected point P' is not included in any one of the circumscribed spheres in step 65, all of the processing object tetrahedra are deleted in step 66, and then the moving node P is shifted to the projected point P' in step 67. When the processing object tetrahedra are deleted, since a polyhedron having triangular faces is formed in the region from which the processing object tetrahedra have been deleted, tetrahedra are re-constructed in the region, in step 68, using a minimum circumscribed sphere method and using the outermost hull faces of the region and the node P' after the movement, thereby ending the processing.

By the processing described above, the intersection between the tetrahedra and the substance boundary is eliminated.

Here, it is examined in what degree the time required for an analysis based on a finite difference method is different between where a triangle mesh is generated in accordance with the present invention and where a triangle mesh is generated using a conventional technique.

It is assumed that, where the number of nodes is n, the analysis time by a finite difference method increases in proportion to n to the 1.5-th power. The number of nodes before elimination of intersections is performed is represented by $n_o$. According to the conventional technique, nodes are added almost unconditionally in order to eliminate intersections, and the number of the thus added nodes is presented by $n_c$. In this instance, the rate r at which the processing of a finite difference method is accelerated by use of the technique of the present invention is given by $$r = \frac{\text{(conventional technique)}}{\text{(present invention)}} = \frac{n_o^{1.5}}{(n_o - n_c)^{1.5} + \alpha}$$

where $\alpha$ is a time required to construct triangles which includes a moving point in the present invention. The calculation for constructing triangles which include a moving point is required to be executed by a finite number of times irrespective of the total number of nodes. More particularly, if the number $n_c$ of nodes to be added for elimination of intersections is $n_c=1,34$ where the node number $n_o=10,252$, reduction in calculation time by approximately 20 percent is achieved by employment of the technique of the present invention.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A method for analyzing a semiconductor device, the method comprising steps of;

receiving as an input a digital representation of the semiconductor device;

generating a triangular mesh from the digital representation of the semiconductor device, the triangular mesh satisfying a condition of Delaunay partition;

searching for triangles which are included in the triangle mesh and intersect a substance boundary, the substance boundary representing an interface between areas in the semiconductor device;

selecting one of the vertices of any of the triangles intersecting with the substance boundary as a moving node, one of the vertices not being on the substance boundary, and projecting the moving node on the substance boundary to obtain a projected point;

listing triangles which commonly have the moving node as processing object triangles and listing those triangles which are positioned around the processing object triangles as peripheral triangles; and checking to detect whether or not the projected point is included in a circumscribed circle about any of the peripheral triangles and, when the projected point is included in a circumscribed circle, adding a node at the projected point and producing triangles using the node, but when the projected point is not included in a circumscribed circle about any one of the peripheral triangles, deleting all of the processing object triangles, shifting the moving node to the projected point and re-constructing triangles in a region, from which the processing object triangles have been removed, using a maximum included angle method.

2. The method as set forth in claim 1, wherein one of vertices of the triangles intersecting with the substance boundary which is spaced by the smallest distance from the substance boundary is selected as the moving node.

3. The method as set forth in claim 1, wherein a data structure is used wherein numbers are individually applied to the triangles and nodes constructing the triangle mesh, and for each of the triangles, numbers of adjacent triangles and numbers of nodes included in the triangle are stored in a memory, whereas for each of the nodes, the numbers of those triangles which have the node as a vertex and coordinate values of the node are stored in the memory.

4. The triangle mesh generation method as set forth in claim 1, wherein the triangle mesh is used for an analysis based on a finite difference method.

5. A method for analyzing a semiconductor device, the method comprising steps of:

receiving as an input a digital representation of the semiconductor device;

generating a tetrahedral mesh from the digital representation of the semiconductor device, the tetrahedral mesh satisfying a condition of Delaunay partition;

searching for tetrahedra which are included in the tetrahedron mesh and intersect with a substance boundary the substance boundary representing an interface between areas in the semiconductor device;

selecting one of the vertices of any of the tetrahedra intersecting with the substance boundary as a moving node, one of the vertices not being on the substance boundary, and projecting the moving node on the substance boundary to obtain a projected point;

listing tetrahedra which commonly have the moving node as processing object tetrahedra and listing tetrahedra which are positioned around the processing object tetrahedra as peripheral tetrahedra; and checking to detect whether or not the projected point is included in a circumscribed sphere about any of the peripheral tetrahedra and, when the projected point is included in a circumscribed sphere, adding a node at the projected point and producing tetrahedra using the node, but when the projected point is not included in a circumscribed sphere about any one of the peripheral tetrahedra, deleting all of the processing object tetrahedra, shifting the moving node to the projected point and re-constructing tetrahedra in a region, from which the processing object tetrahedra have been removed, using a minimum circumscribed circle method.

6. The method as set forth in claim 5, wherein the one of the vertices of the tetrahedra intersecting with the substance boundary which is spaced by the smallest distance from the substance boundary is selected as the moving node.

7. The method as set forth in claim 5, wherein the tetrahedron mesh is used for an analysis based on a finite difference method.

* * * * *